US012764996B2

(12) United States Patent
Chen

(10) Patent No.: US 12,764,996 B2
(45) Date of Patent: Oct. 13, 2026

(54) SEMICONDUCTOR DEVICE WITH TRENCH-TYPED POWER TRANSISTORS AND FABRICATION METHOD THEREOF

(71) Applicant: Ark HDPS Semiconductor Pte. LIMITED., Singapore (SG)

(72) Inventor: Chin-Fu Chen, Hsinchu County (TW)

(73) Assignee: Ark HDPS Semiconductor Pte. LIMITED., Singapore (SG)

( * ) Notice: Subject to any disclaimer, the term of this patent is extended or adjusted under 35 U.S.C. 154(b) by 395 days.

(21) Appl. No.: 18/122,153

(22) Filed: Mar. 16, 2023

(65) Prior Publication Data

US 2023/0327015 A1 Oct. 12, 2023

(30) Foreign Application Priority Data

Apr. 7, 2022 (CN) ........................ 202210361353.9

(51) Int. Cl.
*H10D 30/66* (2025.01)
*H10D 30/01* (2025.01)
*H10D 62/10* (2025.01)
*H10D 64/27* (2025.01)

(52) U.S. Cl.
CPC ....... *H10D 30/668* (2025.01); *H10D 30/0297* (2025.01); *H10D 62/115* (2025.01); *H10D 62/127* (2025.01); *H10D 64/513* (2025.01)

(58) Field of Classification Search
CPC ............ H10D 84/0109; H10D 62/151; H10D 30/0512; H10D 30/0289; H10D 8/25
See application file for complete search history.

(56) References Cited

U.S. PATENT DOCUMENTS

| | | | | |
|---|---|---|---|---|
| 8,936,985 | B2 | 1/2015 | Challa | |
| 2005/0062101 | A1* | 3/2005 | Sugi | H10D 86/01 257/E29.136 |
| 2010/0151643 | A1* | 6/2010 | Hirler | H10D 64/513 438/270 |
| 2014/0124852 | A1* | 5/2014 | Lin | H10D 30/668 257/330 |
| 2016/0020315 | A1* | 1/2016 | Hirler | H10D 62/107 257/329 |
| 2019/0081146 | A1* | 3/2019 | Iwatsu | H10D 30/65 |
| 2020/0135916 | A1* | 4/2020 | Mehrotra | H10D 62/158 |
| 2020/0328302 | A1 | 10/2020 | Lin | |

FOREIGN PATENT DOCUMENTS

TW 202147621 A 12/2021

* cited by examiner

*Primary Examiner* — Brian Turner
(74) *Attorney, Agent, or Firm* — Winston Hsu

(57) ABSTRACT

A semiconductor device includes a substrate and a well region both having a first conductivity type, a trench in the substrate and directly above the well region, a first trench gate and a second trench gate disposed in the trench and laterally separated from each other, a dielectric isolation portion disposed in the trench and between the first and second trench gates, and a dielectric liner in the trench and under bottom surfaces of the first and second trench gates. A middle region of a bottom surface of the dielectric isolation portion protrudes downward and is lower than two side regions of the bottom surface of the dielectric isolation portion. Below a horizontal line of the bottom surfaces of the first and second trench gates, the thickness of the dielectric isolation portion is greater than the thickness of the dielectric liner.

19 Claims, 9 Drawing Sheets

SEMICONDUCTOR DEVICE WITH TRENCH-TYPED POWER TRANSISTORS AND FABRICATION METHOD THEREOF

BACKGROUND OF THE INVENTION

1. Field of the Invention

The present disclosure relates generally to semiconductor technology, and more particularly to semiconductor devices including trench-typed power transistors and fabrication methods thereof.

2. Description of the Prior Art

Power transistors are usually used in power electronic technologies. Power metal oxide semiconductor field effect transistors (power MOSFETs) are devices commonly used in a power conversion system, which include a lateral device such as a laterally-diffused metal oxide semiconductor (LDMOS) field effect transistor (FET), and a vertical device such as a planar gate MOSFET or a trench gate MOSFET, where the trench gate MOSFET has a gate disposed in a trench. While compared with the planar gate MOSFET, the trench gate MOSFET has advantages of smaller unit size and reduced parasitic capacitance. However, in terms of on-state resistance (Ron) and breakdown voltage, the conventional trench gate MOSFETs still cannot satisfy the requirements of power electronic applications in all aspects.

SUMMARY OF THE INVENTION

In view of this, the present disclosure provides semiconductor devices including trench-typed power transistors and fabrication methods thereof to satisfy various requirements of the trench-typed power transistors in power electronic applications, such as reducing on-state resistance (Ron), reducing specific on-resistance (Rsp), enhancing or maintaining breakdown voltage, etc., which is beneficial to the requirements of high-current and low-voltage devices. Therefore, the semiconductor devices of the present disclosure are more efficiently used in a battery management system (BMS).

According to one embodiment of the present disclosure, a semiconductor device is provided and includes a substrate, a well region, a trench, a first trench gate, a second trench gate, a dielectric isolation portion, and a dielectric liner. The substrate has a first conductivity type. The well region has the first conductivity type and is disposed in the substrate. The trench is disposed in the substrate and located directly above the well region. The first trench gate and the second trench gate are laterally separated from each other and disposed in the trench. The dielectric isolation portion is disposed in the trench and between the first trench gate and the second trench gate, where a middle region of a bottom surface of the dielectric isolation portion protrudes downward and is lower than two side regions of the bottom surface of the dielectric isolation portion. The dielectric liner is disposed in the trench and under bottom surfaces of the first trench gate and the second trench gate, where below a horizontal line of the bottom surfaces of the first trench gate and the second trench gate, the thickness of the dielectric isolation portion is greater than the thickness of the dielectric liner.

According to one embodiment of the present disclosure, a semiconductor device is provided and includes a substrate, a well region, a trench, a first trench gate, a second trench gate, a dielectric isolation portion, a first doped region, and a second doped region. The substrate has a first conductivity type. The well region has the first conductivity type and is disposed in the substrate. The trench is disposed in the substrate and located directly above the well region. The first trench gate and the second trench gate are laterally separated from each other and disposed in the trench. The dielectric isolation portion is disposed in the trench and between the first trench gate and the second trench gate. The first doped region and the second doped region have the first conductivity type, and are disposed in the substrate and laterally separated from each other. The first doped region and the second doped region are located on two sides of the well region, respectively. The doping concentration of the well region is higher than the respective doping concentrations of the first doped region and the second doped region.

According to one embodiment of the present disclosure, a semiconductor device is provided and includes a substrate, a well region, a trench, a first trench gate, a second trench gate, and a dielectric isolation portion. The substrate has a first conductivity type. The well region has the first conductivity type and is disposed in the substrate. The trench is disposed in the substrate and located directly above the well region. The first trench gate and the second trench gate are laterally separated from each other and are disposed in the trench. The dielectric isolation portion is disposed in the trench, and a space between the first trench gate and the second trench gate is filled up with the dielectric isolation portion.

According to one embodiment of the present disclosure, a method of fabricating a semiconductor device is provided and includes the following steps. A substrate having a first conductivity type is provided and a trench is formed in the substrate. A dielectric liner is conformally formed on sidewalls and a bottom surface of the trench. A first trench gate and a second trench gate are laterally separated from each other and formed in the trench to expose a portion of the dielectric liner on the bottom surface of the trench. A well region is formed in the substrate, where the well region is located directly under a region between the first trench gate and the second trench gate. A thermal oxidation process is performed to form an oxide layer in the trench. In addition, the trench is filled up with a dielectric material layer, where the dielectric material layer and the oxide layer construct a dielectric isolation portion. The dielectric isolation portion is located between the first trench gate and the second trench gate, and a middle region of a bottom surface of the dielectric isolation portion protrudes downward and is lower than two side regions of the bottom surface of the dielectric isolation portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

FIG. 7 is a schematic diagram illustrating a distribution of voltage equipotential lines in a local area of a semiconductor device according to an embodiment of the present disclosure when the semiconductor device is turned on.

FIG. 8 is a schematic diagram illustrating a current intensity distribution in a local area of a semiconductor device according to an embodiment of the present disclosure when the semiconductor device is turned on.

DETAILED DESCRIPTION

Figure 1:
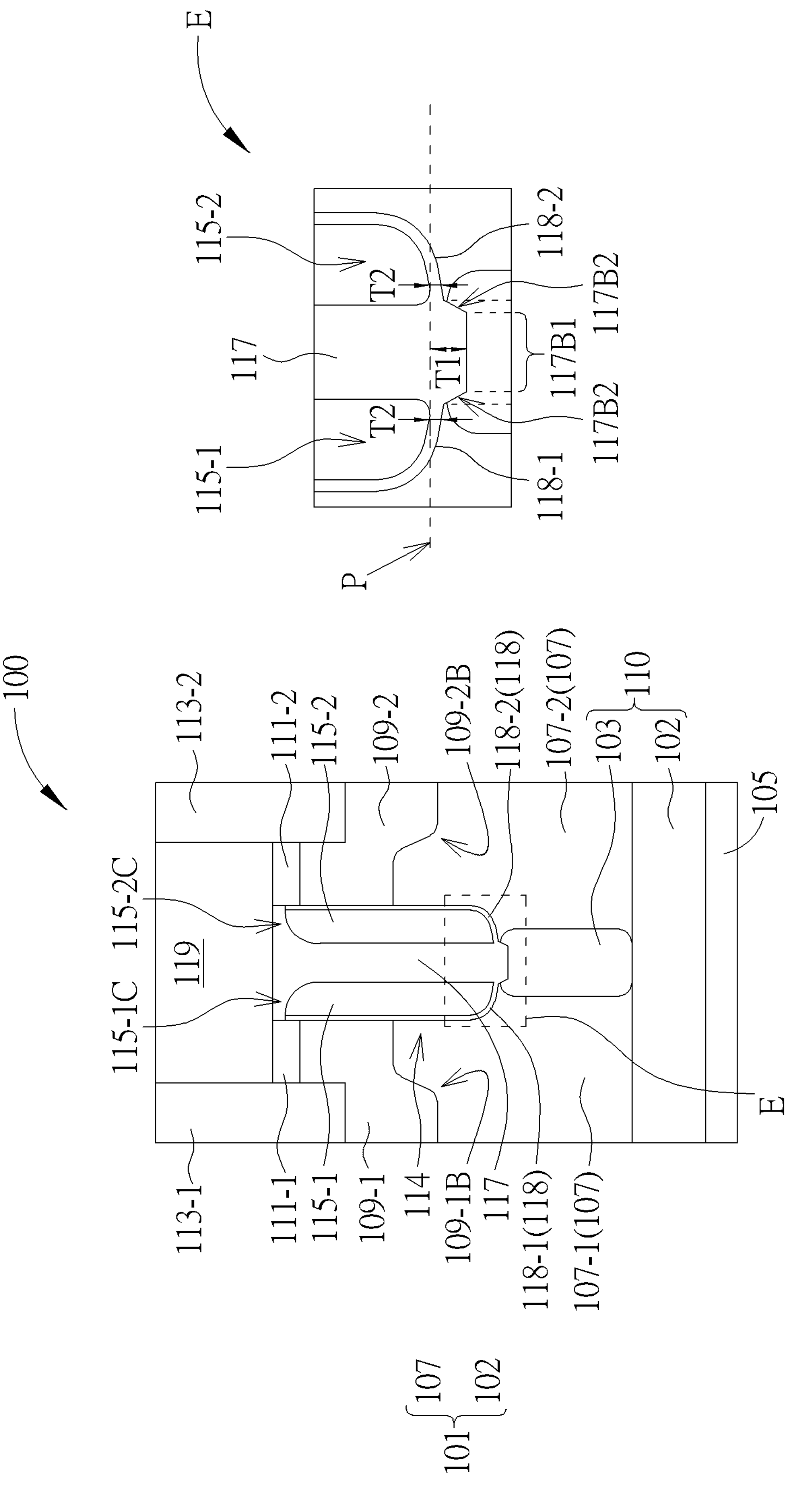
FIG. 1 shows a schematic cross-sectional view and an enlarged view of a local area of a repeating unit of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to semiconductor devices including trench gate power transistors, where two trench gates are laterally separated from each other and disposed in a trench of one repeating unit (cell) of the semiconductor device, a dielectric isolation portion is disposed between the two trench gates, and a well region is disposed directly under the trench and in a substrate. The doping concentration of the well region is higher than the respective doping concentrations of doped regions on two sides of the well region. Moreover, a bottom portion of the substrate also has a higher doping concentration than the well region. In the embodiments of the present disclosure, the well region and the bottom portion of the substrate having higher doping concentrations are used together as a common drain region and the two trench gates are laterally separated from each other and disposed in the trench, thereby reducing source-to-source on-state resistance and reducing specific on-resistance (Rsp) of the semiconductor devices. It is beneficial to the requirements of semiconductor devices for high-current (a maximum current density is for example 5.0E-2A/$cm^2$ to 1.0 A/$cm^2$) and low-voltage (a source-to-source voltage is for example 12V to 30V) applications. Therefore, the semiconductor devices of the present disclosure are effectively applied in a power management system (BMS).

FIG. 1 is a schematic cross-sectional view of a repeating unit (cell) of a semiconductor device according to an embodiment of the present disclosure. As shown in FIG. 1, in one embodiment, a semiconductor device 100 includes a substrate 101 having a first conductivity type. The substrate 101 includes a bottom portion 102 and an epitaxial layer 107 disposed on the bottom portion 102. The bottom portion 102 of the substrate is a heavily doped substrate with the first conductivity type, such as an n-type heavily doped substrate ($N^+$ substrate). The epitaxial layer 107 is formed on the bottom portion 102 and has the first conductivity type, such as an n-type silicon epitaxial layer. In addition, a well region 103, and a first doped region 107-1 and a second doped region 107-2 on two sides of the well region 103 are formed in the epitaxial layer 107. The first doped region 107-1 and the second doped region 107-2 are laterally separated from each other and disposed in the epitaxial layer 107 of the substrate 101. The well region 103, the first doped region 107-1 and the second doped region 107-2 all have the first conductivity type. The doping concentration of the well region 103 is higher than the respective doping concentrations of the first doped region 107-1 and the second doped region 107-2. The doping concentration of the bottom portion 102 of the substrate is higher than the doping concentration of the well region 103. According to the embodiments of the present disclosure, the bottom portion 102 of the substrate and the well region 103 may be used together as a common drain region 110, and a drain electrode 105 of the semiconductor device 100 is disposed on the bottom surface of the substrate 101 and located under the bottom portion 102 of the substrate 101. In one embodiment, the first doped region 107-1 and the second doped region 107-2 have the same doping concentration that may be the same as the doping concentration of the epitaxial layer 107 on the bottom portion 102 of the substrate. The doping concentration of the well region 103 is higher than the same doping concentration of the first doped region 107-1 and the second doped region 107-2. Moreover, in one embodiment, the doping concentration of the bottom portion 102 of the substrate may be gradually decreased in the direction from the bottom surface of the substrate 101 to the well region 103, i.e., the doping concentration of the bottom portion 102 of the substrate may be changed in a gradient.

In addition, the semiconductor device 100 further includes a trench 114 disposed in the epitaxial layer 107 of the substrate 101, and the trench 114 is located directly above the well region 103. According to the embodiments of the present disclosure, a first trench gate 115-1 and a second trench gate 115-2 are disposed in the trench 114 and laterally separated from each other. Moreover, a dielectric isolation portion 117 is also disposed in the trench 114 and located between the first trench gate 115-1 and the second trench gate 115-2. According to an embodiment of the present disclosure, the space between the first trench gate 115-1 and the second trench gate 115-2 is filled up with the dielectric isolation portion 117, i.e., there is no other component disposed in the dielectric isolation portion 117 that is between the first trench gate 115-1 and the second trench gate 115-2. For example, there is no other gate electrode or field plate disposed in the dielectric isolation portion 117. In some embodiments, as shown in FIG. 1, the upper portion of the first trench gate 115-1 has a first round corner 115-1C adjacent to the dielectric isolation portion 117, and the upper portion of the second trench gate 115-2 has a second round corner 115-2C adjacent to the dielectric isolation portion 117. Please refer to the enlarged view of the local area E in FIG. 1, where a middle region 117B1 of the bottom surface of the dielectric isolation portion 117 protrudes downward and is lower than two side regions 117B2 of the bottom surface of the dielectric isolation portion 117. In addition, a dielectric liner 118 is also disposed in the trench 114. The dielectric liner 118 is conformally formed on the sidewalls and the bottom surface of the trench 114, and is located below the bottom surfaces of the first trench gate 115-1 and the second trench gate 115-2. The dielectric liner 118 includes a first dielectric liner 118-1 disposed on the outer sidewall and under the bottom surface of the first trench gate 115-1, and a second dielectric liner 118-2 disposed on the outer sidewall and under the bottom surface of the second trench gate 115-2. As shown in the enlarged view of the local area E of FIG. 1, according to the embodiment of the present disclosure, below a horizontal line P that is aligned with the lowest bottom surfaces of the first trench gate 115-1 and the second trench gate 115-2, the thickness T1 of the dielectric isolation portion 117 is greater than the respective thicknesses T2 of the first dielectric liner 118-1 and the second dielectric liner 118-2.

According to the embodiments of the present disclosure, the doping concentration of the bottom portion 102 of the substrate and the doping concentration of the well region 103 both are higher than the respective doping concentrations of the first doped region 107-1 and the second doped region 107-2, and the well region 103 is adjacent to the bottom surface of the trench 114, thereby reducing the on-state resistance of the semiconductor device 100. In addition, the middle region 117B1 of the bottom surface of the dielectric isolation portion 117 protrudes downward and has the larger thickness T1, thereby preventing current breakdown between the well region 103 and the trench gates (such as the first trench gate 115-1 and/or the second trench gate 115-2), so that the withstand voltage capability of the semiconductor device 100 is improved.

Still referring to FIG. 1, in one embodiment, the semiconductor device 100 further includes a first body region 109-1 and a second body region 109-2 disposed in the substrate 101. The first body region 109-1 and the second body region 109-2 have a second conductivity type that is opposite to the aforementioned first conductivity type. The first body region 109-1 and the second body region 109-2 are such as p-type body regions (p-body). The first body region 109-1 and the second body region 109-2 are disposed directly above the first doped region 107-1 and the second doped region 107-2, respectively, and are located on two sides of the trench 114. In addition, the semiconductor device 100 further includes a first source region 111-1 and a second source region 111-2 that are adjacent to the first body region 109-1 and the second body region 109-2, respectively. The first source region 111-1 and the second source region 111-2 have the first conductivity type, such as n-type heavily doped regions. The semiconductor device 100 further includes an interlayer dielectric (ILD) layer 119 disposed over the epitaxial layer 107 of the substrate 101. The ILD layer 119 also covers the first source region 111-1, the second source region 111-2, the dielectric isolation portion 117 and other features formed in the epitaxial layer 107. A first source electrode 113-1 and a second source electrode 113-2 pass through the ILD layer 119 and are extended into the first body region 109-1 and the second body region 109-2, respectively. The first source region 111-1 is adjacent to the first source electrode 113-1, and the second source region 111-2 is adjacent to the second source electrode 113-2.

As shown in FIG. 1, in some embodiments, the well region 103 of the semiconductor device 100 is laterally separated from the first body region 109-1 and the second body region 109-2, and the top surface of the well region 103 is lower than the respective lowermost bottom surfaces of the first body region 109-1 and the second body region 109-2. Moreover, the respective lowermost bottom surfaces of the body region 109-1 and the second body region 109-2 are higher than the bottom surface of the trench 114. According to some embodiments of the present disclosure, the first body region 109-1 and the second body region 109-2 may have a first inclined bottom surface 109-1B and a second inclined bottom surface 109-2B, respectively. Each of the first inclined bottom surface 109-1B and the second inclined bottom surface 109-2B may be a multi-step shaped bottom surface or a multi-arc shaped bottom surface. A portion of the first inclined bottom surface 109-1B corresponding to the first source region 111-1 is higher and another portion thereof corresponding to the first source electrode 113-1 is lower. A portion of the second inclined bottom surface 109-2B corresponding to the second source region 111-2 is higher, and another portion thereof corresponding to the second source electrode 113-2 is lower.

According to the embodiments of the present disclosure, the first body region 109-1 located directly under the first source electrode 113-1 may have a higher dopant concentration, and the second body region 109-2 located directly under the second source electrode 113-2 may also have a higher dopant concentration, thereby preventing the current directly flowing from the first doped region 107-1 and the second doped region 107-2 to the bottom portions of the first source electrode 113-1 and the second source electrode 113-2, respectively.

Figure 2:
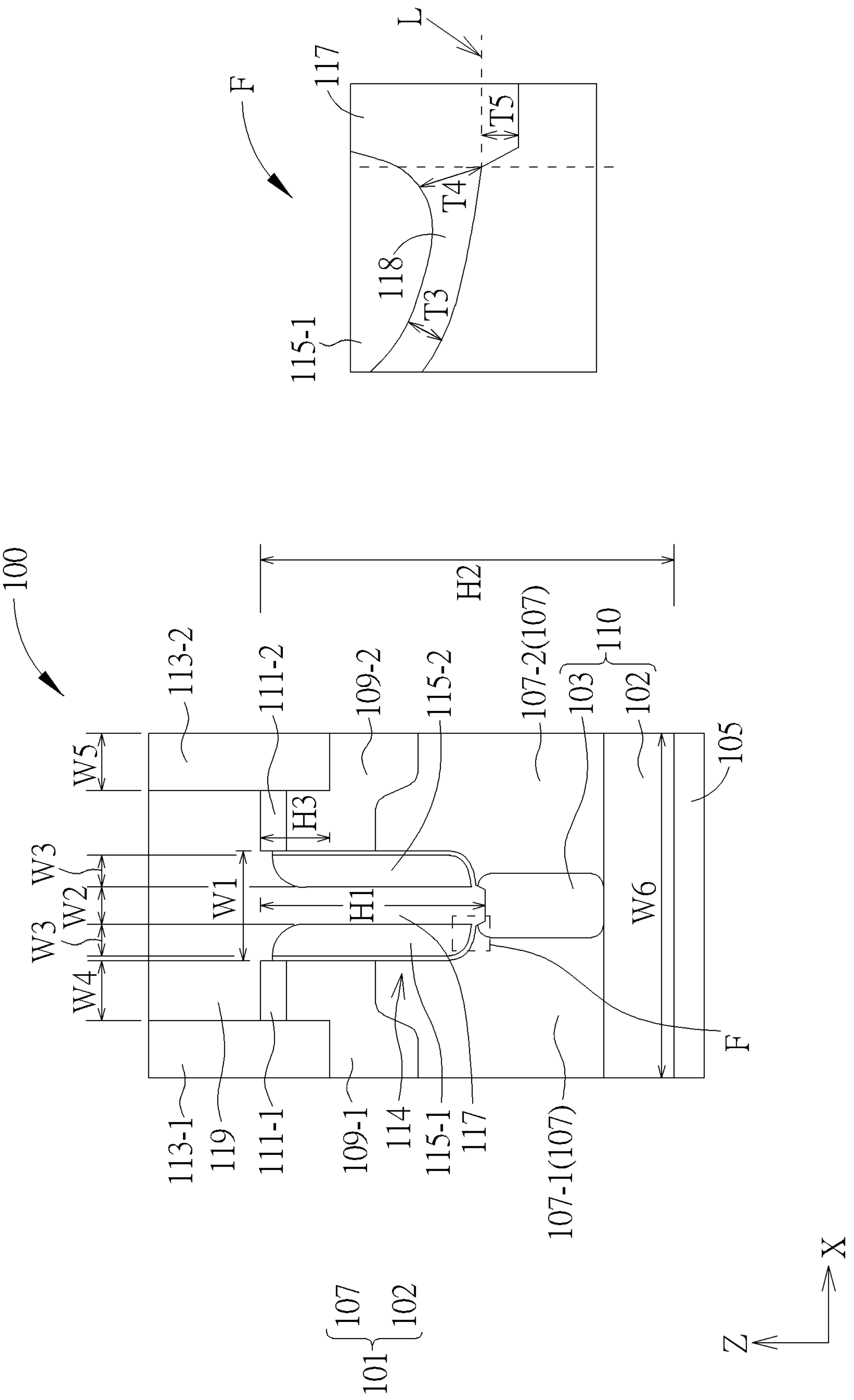
FIG. 2 shows a schematic cross-sectional view and an enlarged view of a local area of a repeating unit of a semiconductor device according to an embodiment of the present disclosure to indicate the dimensions of features of the semiconductor device.

FIG. 2 shows a schematic cross-sectional view and an enlarged view of a local area of a repeating unit of a semiconductor device according to an embodiment of the present disclosure to illustrate the dimensions of various features of the semiconductor device. As shown in FIG. 2, in some embodiments, in the lateral direction (for example, the X-axis direction), the width W1 of the top surface of the trench 114 of the semiconductor device 100 is also the width of the top surface of the dielectric isolation portion 117, which may be about 425 nanometers (nm) to about 475 nm, for example, about 455 nm. The depth H1 of the dielectric isolation portion 117 may be about 500 nm to about 650 nm, for example, about 570 nm. The width W2 of the main portion and the bottom surface of the dielectric isolation portion 117 may be about 135 nm to about 175 nm, for example, about 150 nm. The respective widths W3 of the main portions of the first trench gate 115-1 and the second trench gate 115-2 may be substantially the same, which are about 100 nm to about 130 nm, for example, about 125 nm. The respective widths W4 of the first source region 111-1 and the second source region 111-2 may be substantially the same, such as from about 75 nm to about 125 nm, for example, about 100 nm. The widths W4 are the distances between the first source electrode 113-1 and the trench 114, and between the second source electrode 113-2 and the trench 114, respectively. In one repeating unit (cell), the respective widths W5 of the first source electrode 113-1 and the second source electrode 113-2 may be substantially the same, such as from about 50 nm to about 100 nm, for example, about 75 nm. The width W6 of the drain electrode 105 may be about 700 nm to about 900 nm, for example, about 800 nm. The depth H2 of the substrate 101 (including the bottom portion 102 of the substrate and the epitaxial layer 107 thereon) may be about 900 nm to about 1100 nm, for example, about 1000 nm. The depth H2 of the substrate 101 is also the distance from the top surfaces of the first source region 111-1 and the second source region 111-2 to the bottom surface of the bottom portion 102 of the substrate. The depth H3 of the first source electrode 113-1 and the second source electrode 113-2 extended into the first body region 109-1 and the second body region 109-2, respectively, may be about 100 nm to about 200 nm, for example, about 150 nm. The depth H3 is also the distance from the top surfaces of the first source region 111-1 and second source regions 111-2 to the bottom surfaces of the first source electrode 113-1 and the second source electrode 113-2. The aforementioned values of the dimensions of the features are only illustrated for examples, but not limited thereto. The dimensions of the aforementioned features may be adjusted according to the actual electrical requirements of the semiconductor device 100. In addition, according to the embodiments of the present disclosure, the width W1 of the top surface of the dielectric isolation portion 117 of the semiconductor device 100 is greater than the width W2 of the bottom surface of the dielectric isolation portion 117. Moreover, the maximum width (for example, the width W3) of the first trench gate 115-1 and the maximum width (for example, the width W3) of the second trench gate 115-2 both are smaller than the minimum width (for example, the width W2) of the dielectric isolation portion 117.

Still referring to FIG. 2, an enlarged view of the local area F is also shown therein, where the dielectric isolation portion 117 and the adjacent dielectric liner 118 may construct a bird's beak structure. The thickness T4 of a portion of the dielectric liner 118 adjacent to the dielectric isolation portion 117 is greater than the thickness T3 of another portion of the dielectric liner 118 far from the dielectric isolation portion 117. In some embodiments, the thickness T4 may be about 300 angstroms (Å) to about 400 Å, for example, about 350 Å. The thickness T3 may be about 200 Å to about 300 Å, for example, about 250 Å. In addition, below the horizontal line L that is aligned with the lowest bottom surface of the dielectric liner 118, the thickness T5 of the downwardly protruding portion of the dielectric isolation portion 117 may be about 100 Å to about 200 Å, for example, about 150 Å. The aforementioned values of the thicknesses are only illustrated for examples, but not limited thereto. The aforementioned values of the thicknesses may be adjusted according to the actual electrical requirements of the semiconductor device 100.

Figure 3:
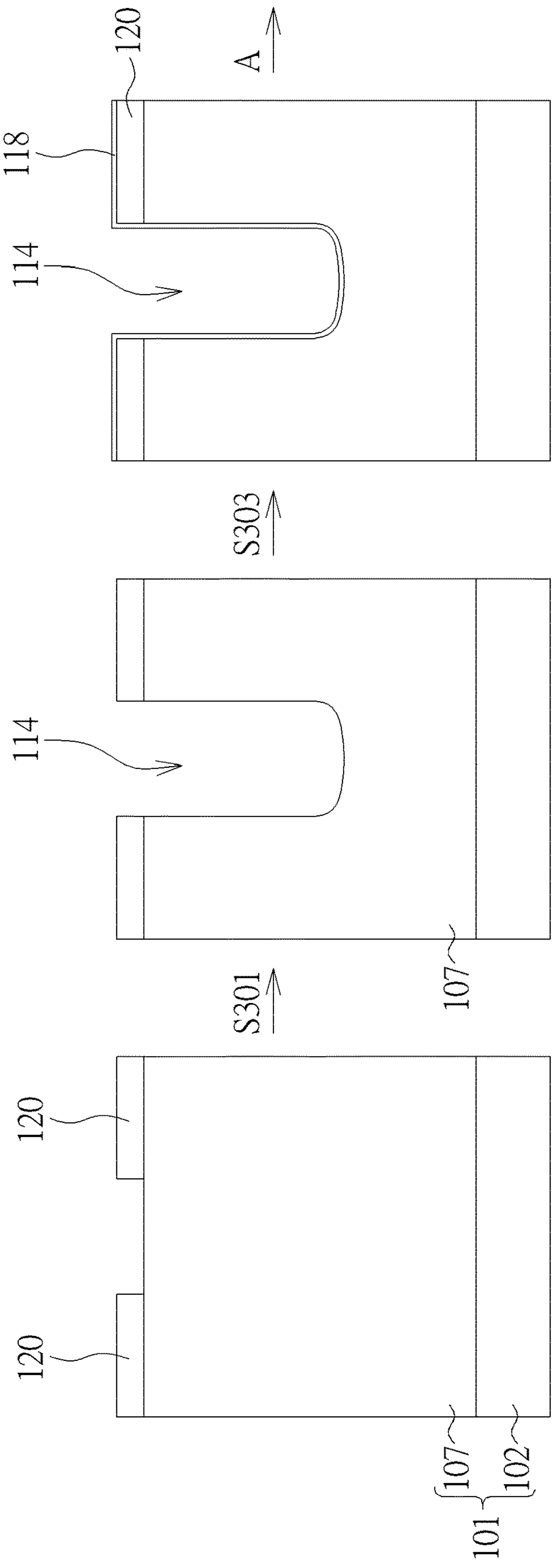
FIG. 3, FIG. 4, and FIG. 5 are schematic cross-sectional views of various stages of a method of fabricating a semiconductor device according to an embodiment of the present disclosure.
Figure 4:
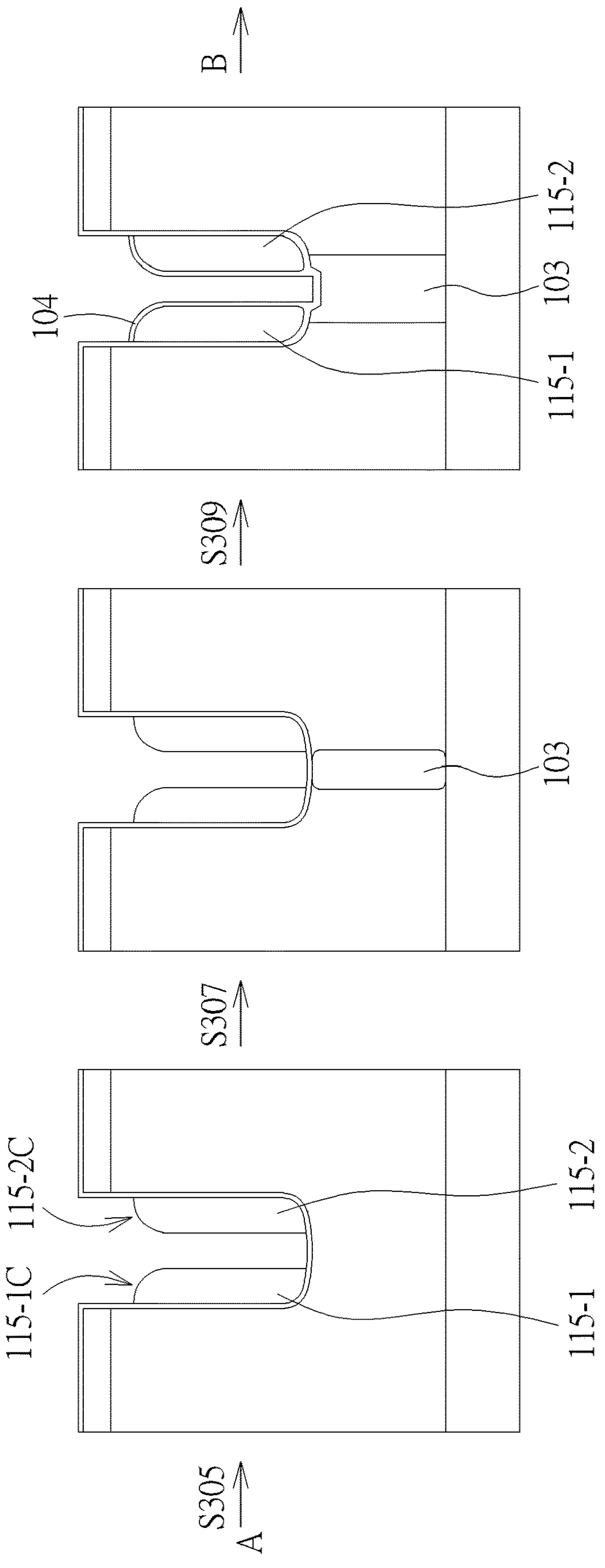
Figure 5:
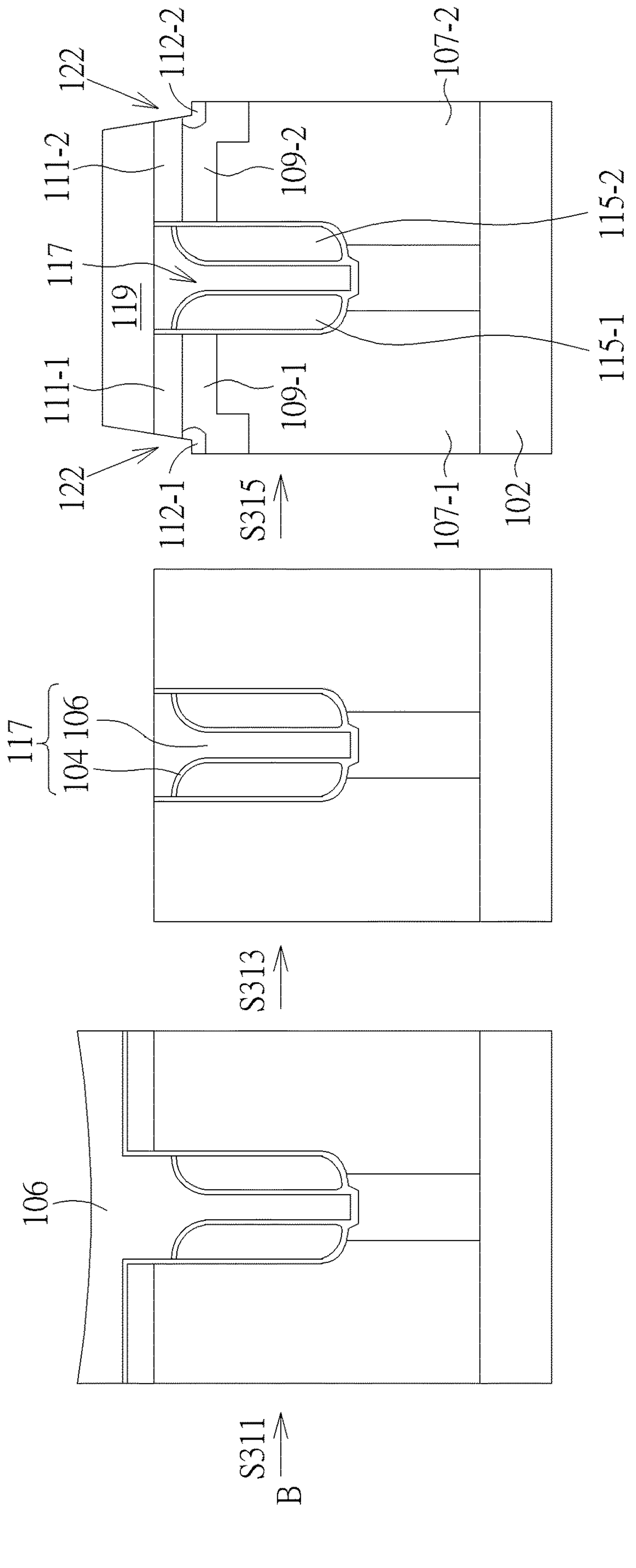

FIG. 3, FIG. 4, and FIG. 5 are schematic cross-sectional views of various stages of a method of fabricating a semiconductor device according to an embodiment of the present disclosure. Firstly, referring to FIG. 3, a substrate 101 is provided and includes a bottom portion 102 and an epitaxial layer 107 formed on the bottom portion 102. In one embodiment, the bottom portion 102 of the substrate is a heavily doped substrate of the first conductivity type, for example, an n-type heavily doped silicon substrate (N+Si substrate). The epitaxial layer 107 is a silicon epitaxial layer of the first conductivity type, and the doping concentration of the epitaxial layer 107 is lower than the doping concentration of the bottom portion 102 of the substrate. For example, the highest doping concentration of the bottom portion 102 of the substrate is about 6E19 $cm^{-3}$, and the doping concentration of the epitaxial layer 107 is about 7E16 $cm^{-3}$, but not limited thereto. According to the embodiments of the present disclosure, the bottom portion 102 of the substrate and the epitaxial layer 107 may be formed of the same semiconductor material, such as both are epitaxial layers of silicon. Next, a patterned hard mask 120 is formed on the top surface of the substrate 101. The patterned hard mask 120 may be formed by photolithography and etching processes and an opening of the patterned hard mask 120 corresponds to the predetermined area of a subsequently formed trench. Then, at step S301, an etching process is performed on the substrate 101 to form a trench 114 in the epitaxial layer 107. Next, at step S303, a dielectric liner 118 is conformally formed on the sidewalls and bottom surface of the trench 114 and on the top surface and the sidewalls of the patterned hard mask 120. In some embodiments, the dielectric liner 118 is for example, silicon oxide, silicon nitride, silicon oxynitride, or other high-k dielectric materials. The dielectric liner 118 may be formed by a thermal oxidation, a chemical vapor deposition (CVD), or a physical vapor deposition (PVD) process. The thickness of the dielectric liner 118 may be about 200 Å to about 350 Å, but not limited thereto.

Then, referring to FIG. 4, at step S305, a first trench gate 115-1 and a second trench gate 115-2 are formed in the trench 114 and laterally separated from each other. According to the embodiments of the present disclosure, firstly, a conductive material layer may be conformally deposited on the dielectric liner 118 in the trench 114 and on the patterned hard mask 120. The conductive material layer may be polysilicon, doped polysilicon, metal silicide, metal, alloy, or other suitable conductive materials. Thereafter, an anisotropic etching process is performed to remove a horizontal portion of the conductive material layer, for example, the horizontal portion of the conductive material layer on the bottom surface of the trench 114 and on the top surface of the patterned hard mask 120 is removed, and the vertical portion of the conductive material layer in the trench 114 is remained to form the first trench gate 115-1 and the second trench gate 115-2, so that a portion of the dielectric liner 118 on the bottom surface of the trench 114 is exposed. Moreover, the opposite inner sides of the first trench gate 115-1 and the second trench gate 115-2 formed by the anisotropic etching process have rounded top corners 115-1C and 115-2C, respectively. Next, at step S307, an ion implantation process is performed on the epitaxial layer 107 through the opening between the first trench gate 115-1 and the second trench gate 115-2 to implant ions of the first conductivity type therein to form a well region 103, such as an n-type heavily doped region ($N^+$ region). The well region 103 is located directly under the region between the first trench gate 115-1 and the second trench gate 115-2. Since the first trench gate 115-1 and the second trench gate 115-2 may be used as a mask for the ion implantation process, the width of the well region 103 may be substantially equal to the width of the region between the first trench gate 115-1 and the second trench gate 115-2.

Then, still referring to FIG. 4, at step S309, a thermal oxidation process is performed to form an oxide layer 104 in the trench 114. At the step S309, the exposed surfaces of the first trench gate 115-1 and the second trench gate 115-2 are oxidized, so that the widths of the first trench gate 115-1 and the second trench gate 115-2 at this step are slightly smaller than the initial widths thereof formed at the step S305. Moreover, through the thermal oxidation process, a portion of the top surface of the well region 103 is also oxidized. Accordingly, a portion of the oxide layer 104 is formed in the region below the opening between the first trench gate 115-1 and the second trench gate 115-2 to protrude downward while compared to the initial bottom surface of the trench 114, so that the thickness of a dielectric portion located at the middle region of the bottom surface of the trench 114 is increased, such as the initial thickness of the dielectric liner 118 plus the thickness of the portion of the oxide layer 104. Moreover, the width of the well region 103 may also be widened by the process temperature of this thermal oxidation process. For example, the width of the well region 103 may be larger than the width of the region between the first trench gate 115-1 and the second trench gate 115-2. In addition, the portions of the epitaxial layer 107 located on two opposite sides of the well region 103 constitute a first doped region 107-1 and a second doped region 107-2, respectively, as shown in FIG. 1. In some embodiments, the bottom portion 102 of the substrate, the epitaxial layer 107 and the well region 103 all have the first conductivity type. Moreover, the doping concentration of the bottom portion 102 of the substrate may be gradually decreased in the direction from the bottom surface to the top surface of the bottom portion 102. The doping concentration of the epitaxial layer 107 is lower than the lowest doping concentration of the bottom portion 102 of the substrate. Accordingly, the doping concentration of the substrate 101 is gradually decreased in the direction from the bottom to the top of the substrate 101. The portions of the epitaxial layer 107 with the lower doping concentration and located near the top surface of the substrate 101 constitute the first doped region 107-1 and the second doped region 107-2, and the well region 103 is a heavily doped region, so that the doping concentration of the well region 103 is higher than the respective doping concentrations of the first doped region 107-1 and the second doped region 107-2.

Then, referring to FIG. 5, at step S311, the trench 114 is filled up with a dielectric material layer 106 and the dielectric material layer 106 is also deposited on the top surface of the patterned hard mask 120. Next, at step S313, a chemical mechanical planarization (CMP) process or an etching back process is performed to remove the patterned hard mask 120 and a portion of the dielectric material layer 106, so that the top surfaces of the oxide layer 104 and the dielectric material layer 106 in the trench 114 are level with the top surface of the epitaxial layer 107 of the substrate 101, where the oxide layer 104 and the dielectric material layer 106 remained in the trench 114 constitute a dielectric isolation portion 117, and the dielectric isolation portion 117 is located between the first trench gate 115-1 and the second trench gate 115-2. Moreover, a middle region 117B1 of the bottom surface of the dielectric isolation portion 117 protrudes downward and is lower than two side regions 117B2 of the bottom surface of the dielectric isolation portion 117 (as shown in FIG. 1).

Still referring to FIG. 5, at step S315, a first body region 109-1 and a second body region 109-2 are formed in the epitaxial layer 107 of the substrate 101. Multiple ion implantation processes with different implantation energies, different ion beam densities, and the same conductivity type may be used to implant ions of the second conductivity type in the epitaxial layer 107 to simultaneously form the first body region 109-1 and the second body region 109-2 on two sides of the trench 114, respectively. Moreover, each of the first body region 109-1 and the second body region 109-2 has a multi-step shaped bottom surface or a multi-arc shaped bottom surface. Then, ions of the first conductivity type are implanted into the first body region 109-1 and the second body region 109-2 to form a first source region 111-1 and a second source region 111-2, respectively. The first source region 111-1 and the second source region 111-2 are adjacent to and located directly above the first body region 109-1 and the second body region 109-2, respectively. Next, an interlayer dielectric (ILD) layer 119 is deposited over the substrate 101, and then openings 122 for a first source electrode and a second source electrode are formed in the ILD layer 119 by photolithography and etching processes. The openings 122 pass through the ILD layer 119, the first source region 111-1 and the second source region 111-2, and are extended downward into the first body region 109-1 and the second body region 109-2, respectively, until a position in the depth of the first body region 109-1 and the second body region 109-2. Thereafter, an ion implantation process of the second conductivity type is performed through the openings 122 to form heavily doped regions 112-1 and 112-2 in the first body region 109-1 and the second body region 109-2, respectively, for example, p-type heavily doped regions ($P^+$ regions). Next, the openings 122 are filled up with a metal material to form the first source electrode 113-1 and the second source electrode 113-2 as shown in FIG. 1, and the semiconductor device 100 is completed.

Figure 6:
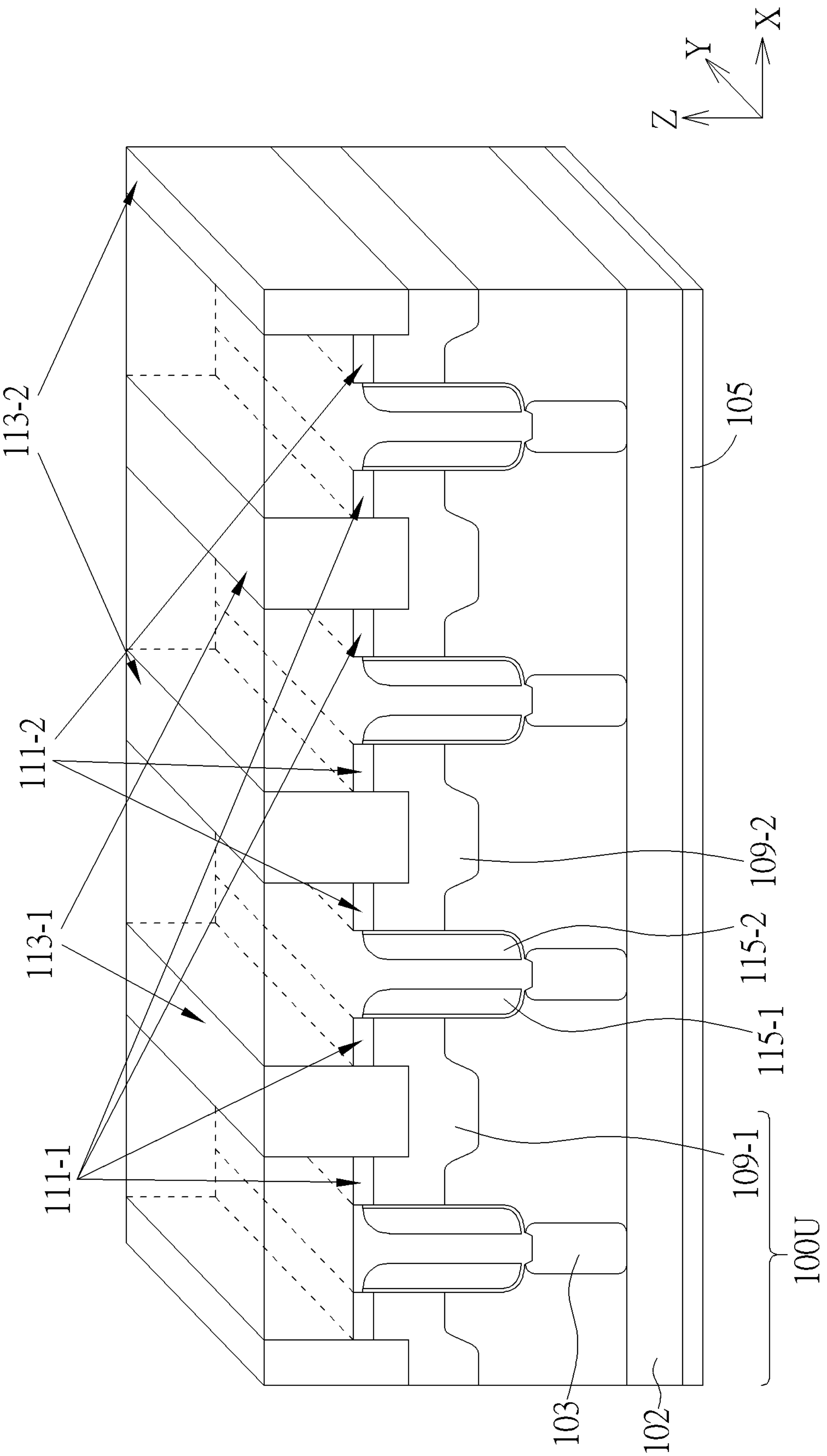
FIG. 6 is a schematic perspective view of a structure including four continuous repeating units of a semiconductor device according to an embodiment of the present disclosure.

FIG. 6 is a perspective view of a structure including four continuous repeating units of a semiconductor device according to an embodiment of the present disclosure. As shown in FIG. 6, four continuous repeating units 100U of the semiconductor device are arranged along a lateral direction (for example, the X-axis direction). The long axis of the first source region 111-1 of the semiconductor device is extended substantially along a longitudinal direction (for example, the Y-axis direction) and located on two sides of the bottom of the first source electrode 113-1. The long axis of the second source region 111-2 is also extended substantially along the longitudinal direction (for example, the Y axis direction), and located on two sides of the bottom of the second source electrode 113-2. Moreover, the long axes of the first source electrode 113-1 and the second source electrode 113-2 are also extended substantially along the longitudinal direction (for example, the Y-axis direction).

Figure 7:
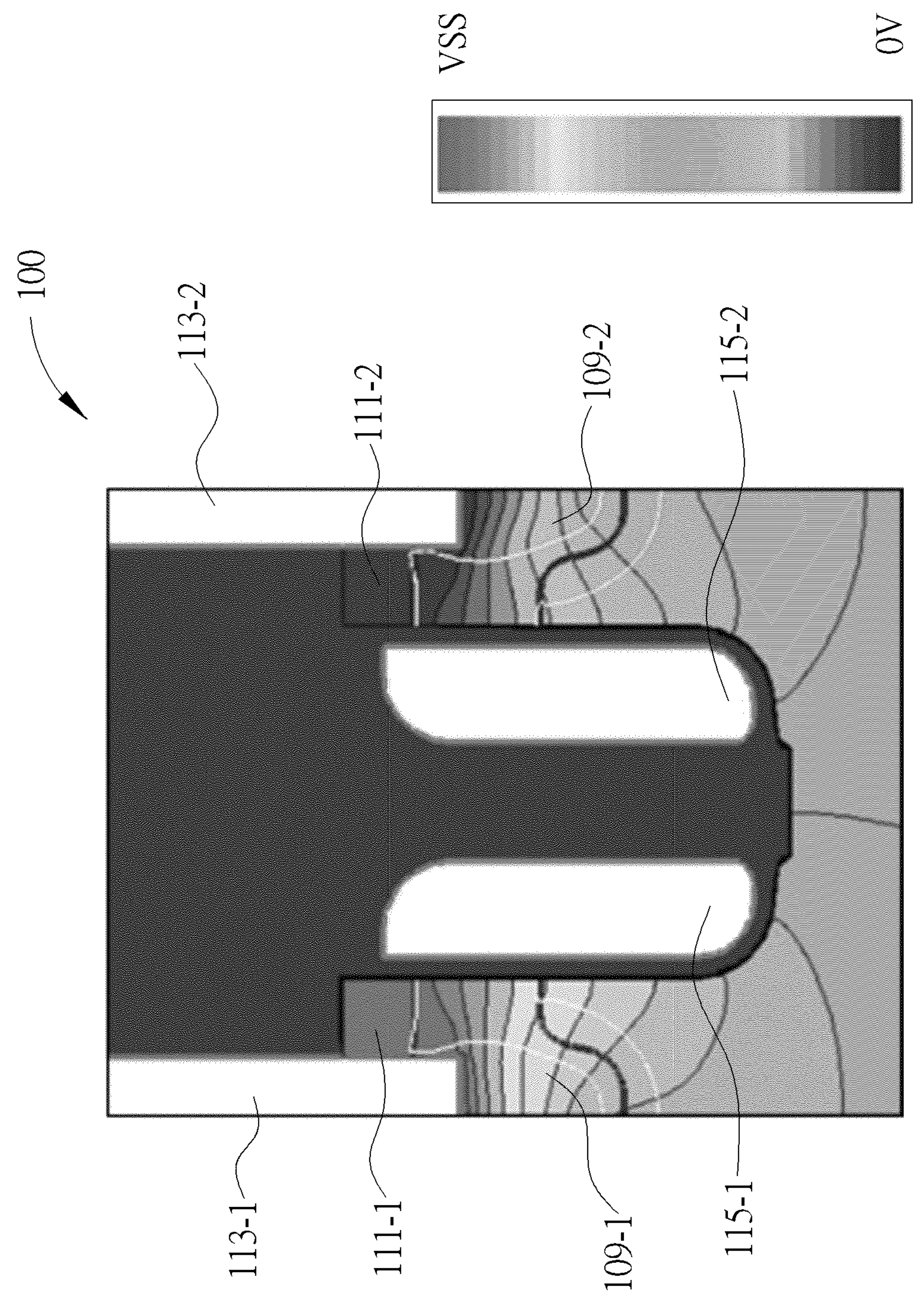

FIG. 7 is a schematic diagram illustrating a distribution of voltage equipotential lines in a local area of a semiconductor device according to an embodiment of the present disclosure when the semiconductor device is turned on. VSS as shown in FIG. 7 is an on-state voltage, for example, about 0.1 volt (V). As shown in FIG. 7, according to the embodiments of the present disclosure, when the semiconductor device 100 is turned on, the well region 103 and the bottom portion 102 of the substrate of the semiconductor device have a good blocking effect, so that the first source region 111-1 is still maintained at a relatively high voltage, thereby improving the on-state resistance of the semiconductor device 100. Therefore, the resistance of the channel region of the semiconductor device 100 is reduced by about 50%, thereby achieving the effect of reducing the specific on-resistance (Rsp) of the semiconductor device, which is beneficial to the semiconductor devices for high-current and low-voltage applications.

Figure 8:
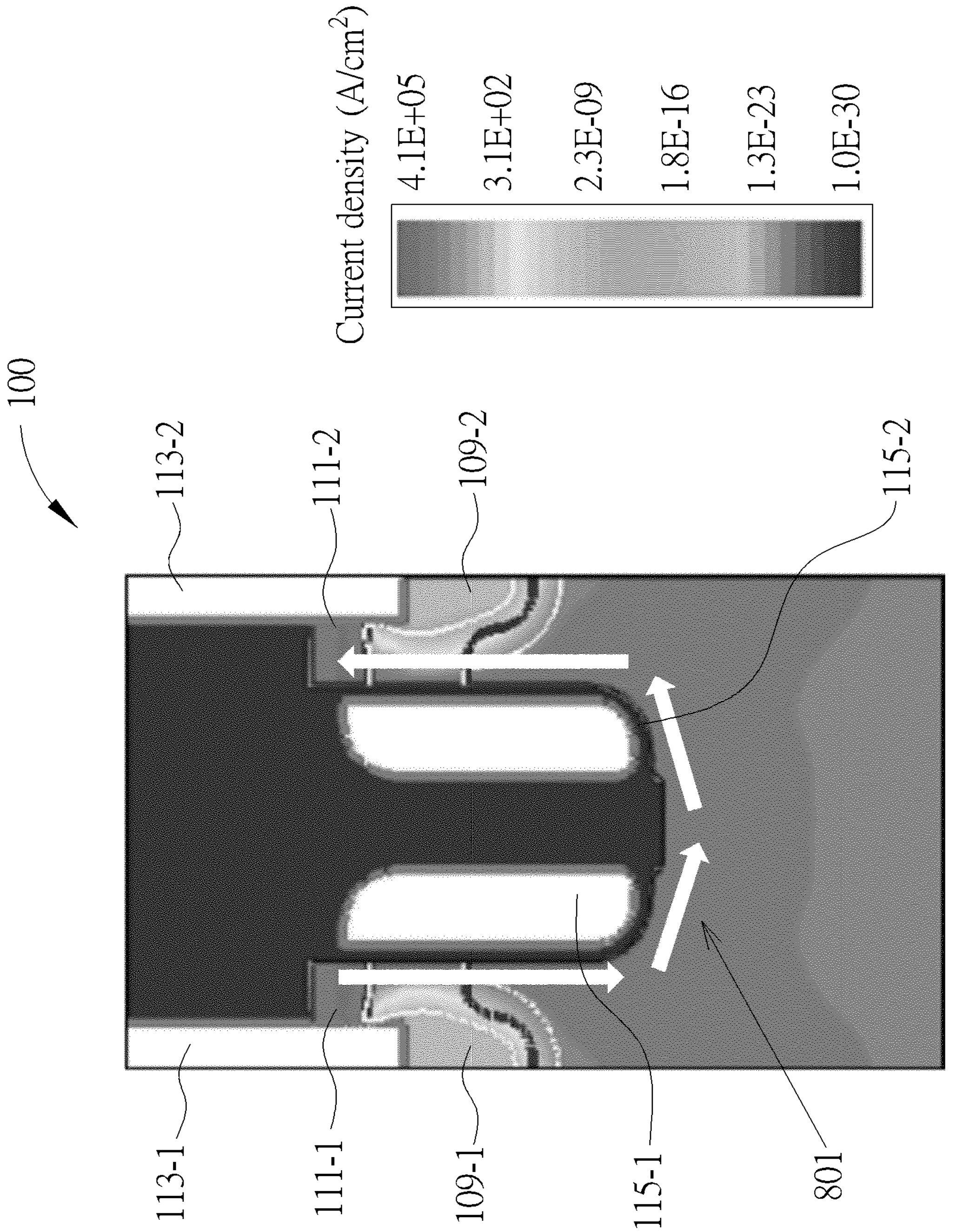

FIG. 8 is a schematic diagram illustrating a current intensity distribution in a local area of a semiconductor device according to an embodiment of the present disclosure when the semiconductor device is turned on. As shown in FIG. 8, according to the embodiments of the present disclosure, when the semiconductor device 100 is turned on, a current path 801 as shown can flow downward from the first source region 111-1 along the outer side of the first trench gate 115-1, and flow along the bottom of the first trench gate 115-1 toward the bottom of the second trench gate 115-2, and then flow upward to the second source region 111-2 along the outer side of the second trench gate 115-2, where the channel region along the entire periphery of the trench has a higher current density which demonstrates that the semiconductor device 100 of the embodiments of the present disclosure can effectively reduce the on-state resistance, and it is beneficial to the semiconductor devices for high-current and low-voltage applications.

Figure 9:
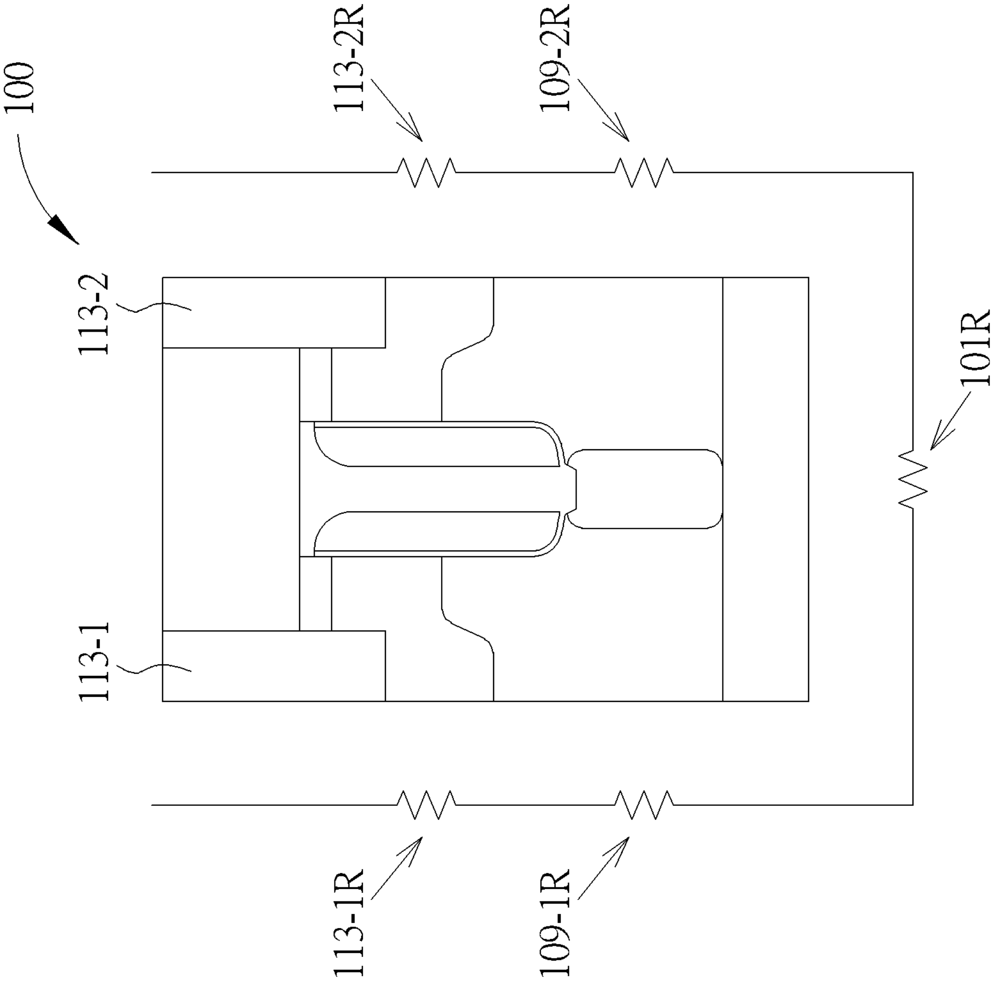
FIG. 9 is a schematic diagram illustrating a distribution of on-state resistances of a semiconductor device according to an embodiment of the present disclosure.

FIG. 9 is a schematic diagram illustrating a distribution of on-state resistances of a semiconductor device according to an embodiment of the present disclosure. As shown in FIG. 9, in one embodiment, a source-to-source on-state resistance (Rss) of the semiconductor device 100 is composed of a resistance 113-1R of the first source electrode 113-1, a channel resistance 109-1R along the periphery of the first trench gate 115-1, a resistance 101R of the epitaxial layer 107, a channel resistance 109-2R along the periphery of the second trench gate 115-2, and a resistance 113-2R of the second source electrode 113-2. Since the semiconductor device 100 of the present disclosure includes the first trench gate 115-1 and the second trench gate 115-2 both disposed in the same trench, the cell pitch of the semiconductor device 100 of the present disclosure may be reduced to be about 80% of the cell pitch of the conventional semiconductor devices with the structure of a single gate in the trench (a single trench gate structure), thereby reducing the channel resistances 109-1R and 109-2R of the semiconductor devices of the present disclosure to be about 80% of that of the conventional semiconductor device. In addition, as shown in FIG. 1, the dielectric isolation portion 117 of the semiconductor device 100 of the present disclosure has the middle region 117B1 of the bottom surface that protrudes downward from the two side regions 117B2 of the bottom surface of the dielectric isolation portion 117. Accordingly, the dielectric isolation portion 117 has a relatively thick bottom portion. Moreover, the heavily doped well region 103 of the first conductivity type is disposed directly under the dielectric isolation portion 117. Therefore, the resistance 101R of the epitaxial layer 107 is reduced to be about 55% of that of the conventional semiconductor device with a single trench gate structure. In addition, the source electrodes 113-1 and 113-2 at the top surface of the semiconductor devices of the present disclosure may forma common source layout by using a redistribution layer (RDL), and thus a carrier substrate may be omitted. Accordingly, the semiconductor devices of the present disclosure may not have a carrier substrate resistance. Therefore, compared with the conventional semiconductor device (MOS devices) having a single trench gate structure, the semiconductor devices of the present disclosure may not only significantly reduce the source-to-source on-state resistance (Rss) to further reduce the specific on-resistance (Rsp) of the semiconductor devices, but also maintain a certain breakdown voltage of the semiconductor devices. Therefore, the semiconductor devices of the present disclosure are beneficial to the semiconductor devices for high-current and low-voltage applications, and the efficiency of the semiconductor devices applied in a power management system is also improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate, having a first conductivity type;

a well region, having the first conductivity type and disposed in the substrate;

a trench, disposed in the substrate and directly above the well region;

a first trench gate and a second trench gate, disposed in the trench and laterally separated from each other;

a dielectric isolation portion, disposed in the trench and between the first trench gate and the second trench gate, wherein a middle region of a bottom surface of the dielectric isolation portion protrudes downward and is lower than two side regions of the bottom surface of the dielectric isolation portion, the two side regions are lower than bottom surfaces of the first trench gate and the second trench gate, and the dielectric isolation portion continuously extends from the first trench gate to the second trench gate; and a dielectric liner, disposed in the trench and under bottom surfaces of the first trench gate and the second trench gate, wherein below a horizontal line of the bottom surfaces of the first trench gate and the second trench gate, the thickness of the dielectric isolation portion is greater than the thickness of the dielectric liner.

2. The semiconductor device of claim 1, further comprising:

a first doped region and a second doped region, having the first conductivity type, disposed in the substrate and laterally separated from each other, wherein the first doped region and the second doped region are located on two sides of the well region, respectively.

3. The semiconductor device of claim 2, wherein the first doped region and the second doped region have a same doping concentration, and a doping concentration of the well region is higher than the same doping concentration.

4. The semiconductor device of claim 2, further comprising:

a first body region and a second body region, having a second conductivity type opposite to the first conductivity type, disposed directly above the first doped region and the second doped region, respectively, and located on two sides of the trench.

5. The semiconductor device of claim 4, wherein the well region is laterally separated from the first body region and the second body region, and a top surface of the well region is lower than bottom surfaces of the first body region and the second body region.

6. The semiconductor device of claim 4, further comprising:

a first source region and a second source region, having the first conductivity type and adjacent to the first body region and the second body region, respectively; and a first source electrode and a second source electrode, extended into the first body region and the second body region, respectively, wherein the first source region is adjacent to the first source electrode, and the second source region is adjacent to the second source electrode.

7. The semiconductor device of claim 6, wherein the first body region has a first inclined bottom surface, the second body region has a second inclined bottom surface, a portion of the first inclined bottom surface corresponding to the first source region is higher than another portion of the first inclined bottom surface corresponding to the first source electrode, a portion of the second inclined bottom surface corresponding to the second source region is higher than another portion of the second inclined bottom surface corresponding to the second source electrode.

8. The semiconductor device of claim 1, wherein the dielectric liner is conformally disposed on sidewalls and a bottom surface of the trench, and a thickness of a portion of the dielectric liner adjacent to the dielectric isolation portion is greater than a thickness of another portion of the dielectric liner away from the dielectric isolation portion.

9. The semiconductor device of claim 1, wherein the first trench gate has a first rounded top corner adjacent to the dielectric isolation portion, and the second trench gate has a second rounded top corner adjacent to the dielectric isolation portion.

10. The semiconductor device of claim 1, wherein a doping concentration of a bottom portion of the substrate is higher than a doping concentration of the well region, and the bottom portion of the substrate and the well region together constitute a common drain region.

11. A semiconductor device, comprising:

a substrate, having a first conductivity type;

a well region, having the first conductivity type and disposed in the substrate;

a trench, disposed in the substrate and directly above the well region;

a first trench gate and a second trench gate, disposed in the trench and laterally separated from each other;

a dielectric isolation portion, disposed in the trench and between the first trench gate and the second trench gate; and a first doped region and a second doped region, having the first conductivity type, disposed in the substrate and laterally separated from each other, wherein the first doped region and the second doped region are located on two sides of the well region, respectively, a doping concentration of the well region is higher than respective doping concentrations of the first doped region and the second doped region, and a bottom surface of the well region, a bottom surface of the first doped region, and a bottom surface of the second doped region are substantially on the same plane.

12. The semiconductor device of claim 11, further comprising a first body region and a second body region, having a second conductivity type opposite to the first conductivity type, disposed directly above the first doped region and the second doped region, respectively and located on two sides of the trench, wherein a top surface of the well region is lower than bottom surfaces of the first body region and the second body region.

13. The semiconductor device of claim 11, wherein a doping concentration of a bottom portion of the substrate is higher than a doping concentration of the well region, and the bottom portion of the substrate and the well region together constitute a common drain region.

14. The semiconductor device of claim 11, further comprising a dielectric liner conformally disposed on sidewalls and a bottom surface of the trench and located below bottom surfaces of the first trench gate and the second trench gate, wherein a thickness of a portion of the dielectric liner adjacent to the dielectric isolation portion is greater than a thickness of another portion of the dielectric liner away from the dielectric isolation portion.

15. A method of fabricating a semiconductor device, comprising:

providing a substrate having a first conductivity type;

forming a trench in the substrate;

conformally forming a dielectric liner on sidewalls and a bottom surface of the trench;

forming a first trench gate and a second trench gate in the trench and laterally separated from each other to expose a portion of the dielectric liner on the bottom surface of the trench and between the first trench gate and the second trench gate;

forming a well region in the substrate, wherein the well region is located directly below a region between the first trench gate and the second trench gate;

performing a thermal oxidation process to form an oxide layer in the trench and between the first trench gate and the second trench gate, wherein the oxide layer protrudes downward into the well region; and filling up the trench with a dielectric material layer, wherein the dielectric material layer and the oxide layer constitute a dielectric isolation portion, the dielectric isolation portion is located between the first trench gate and the second trench gate, and a middle region of a bottom surface of the dielectric isolation portion protrudes downward and is lower than two side regions of the bottom surface of the dielectric isolation portion.

16. The method of claim 15, wherein a doping concentration of the substrate is gradually decreased in a direction from a bottom to a top of the substrate, a portion of the substrate with a lower doping concentration and near a top surface of the substrate constitutes a first doped region and a second doped region that are located on two sides of the well region, and a doping concentration of the well region is higher than respective doping concentrations of the first doped region and the second doped region.

17. The method of claim 16, further comprising:

forming a first body region and a second body region having a second conductivity type opposite to the first conductivity type and located directly above the first doped region and the second doped region, respectively.

18. The method of claim 17, further comprising:

forming a first source region and a second source region having the first conductivity type and adjacent to the first body region and the second body region, respectively; and forming a first source electrode and a second source electrode to be extended into the first body region and the second body region, respectively, wherein the first source region is located on two sides of a bottom portion of the first source electrode, and the second source region is located on two sides of a bottom portion of the second source electrode.

19. The method of claim 18, wherein the first body region and the second body region are formed together by a plurality of ion implantation processes, and each of the first body region and the second body region has a multi-step shaped bottom surface or a multi-arc shaped bottom surface, a portion of the bottom surface of the first body region corresponding to the first source region is higher than another portion of the bottom surface of the first body region corresponding to the first source electrode, and a portion of the bottom surface of the second body region corresponding to the second source region is higher than another portion of the bottom surface of the second body region corresponding to the second source electrode.

* * * * *